(12) United States Patent
Wang et al.

(10) Patent No.: US 11,815,391 B2
(45) Date of Patent: Nov. 14, 2023

(54) LIGHT SENSING MODULE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Jiahua Wang, Beijing (CN); Xianfeng Yang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 36 days.

(21) Appl. No.: 17/509,081

(22) Filed: Oct. 25, 2021

(65) Prior Publication Data
US 2022/0291038 A1    Sep. 15, 2022

(30) Foreign Application Priority Data

Mar. 15, 2021    (CN) .......................... 202110277937.3

(51) Int. Cl.
*G01J 1/42*    (2006.01)
*H05K 1/18*    (2006.01)

(52) U.S. Cl.
CPC ............ *G01J 1/4204* (2013.01); *H05K 1/181* (2013.01); *H05K 2201/0969* (2013.01);
(Continued)

(58) Field of Classification Search
CPC ................. G01J 1/4204; H05K 1/181; H05K 2201/09072; H05K 2201/0969;
(Continued)

(56) References Cited

U.S. PATENT DOCUMENTS

| 2015/0098191 A1* | 4/2015 | Kim ................. H01L 31/02325 361/705 |
| 2016/0013262 A1 | 1/2016 | England et al. |
| 2016/0211204 A1 | 7/2016 | Hu et al. |

FOREIGN PATENT DOCUMENTS

| CN | 1925163 A | 3/2007 |
| CN | 104538462 A | 4/2015 |
| | (Continued) | |

OTHER PUBLICATIONS

Office Action dated Nov. 18, 2021 for Chinese Patent Application No. 202110277937.3 and English Translation.

*Primary Examiner* — Tony Ko
(74) *Attorney, Agent, or Firm* — Ling Wu; Stephen Yang; Ling and Yang Intellectual Property

(57) ABSTRACT

A light sensing module and a display apparatus are provided. The light sensing module includes a circuit board and a light sensing device, wherein the circuit board includes a mounting region and a device region surrounding the mounting region, an encapsulation layer is disposed on the device region, and a light sensing device, a light sensing hole and a barrier structure are provided on the mounting region, a vertical projection of the light sensing device on the mounting region at least partially overlaps with a vertical projection of the light sensing hole on the mounting region, and the barrier structure is disposed around the periphery of the light sensing hole, and separates the encapsulation layer from the light sensing hole.

18 Claims, 2 Drawing Sheets

(52) U.S. Cl.
CPC ............. *H05K 2201/09072* (2013.01); *H05K 2201/0989* (2013.01); *H05K 2201/09745* (2013.01); *H05K 2201/10151* (2013.01)

(58) Field of Classification Search
CPC . H05K 2201/09745; H05K 2201/0989; H05K 2201/10151; H05K 3/3431; H05K 3/28; H05K 2201/09909; G09G 3/3413
See application file for complete search history.

(56) References Cited

FOREIGN PATENT DOCUMENTS

| | | |
|---|---|---|
| CN | 105845638 A | 8/2016 |
| CN | 107734227 A | 2/2018 |
| CN | 110571229 A | 12/2019 |
| CN | 211266954 U | 8/2020 |
| CN | 112087850 A | 12/2020 |
| TW | 201603066 A | 1/2016 |

\* cited by examiner

LIGHT SENSING MODULE AND DISPLAY APPARATUS

CROSS-REFERENCE TO RELATED APPLICATION

The present application claims the priority of Chinese Patent Application No. 202110277937.3 filed to the CNIPA on Mar. 15, 2021, the content of which is hereby incorporated by reference.

TECHNICAL FIELD

Embodiments of the present disclosure relate to, but are not limited to the technical field of light sensing, in particular to a light sensing module and a display apparatus.

BACKGROUND

Current light sensing devices can sense surrounding light and instruct a single-chip microcomputer to automatically adjust brightness of a display, thereby improving the display effect while reducing the power consumption of products. This feature has been widely used (such as in cell phones, watches, tablet computers, etc.). However, because the device region requires protection by arranging an encapsulation layer, material of the encapsulation layer might flow into a light sensing hole during formation of the encapsulation layer, and block a light sensing region, which causes the problem of a decrease of a light sensitivity of the light sensing component.

SUMMARY

The following is a summary of the subject matters described in the present disclosure in detail. The summary is not intended to limit the scope of protection of the claims.

In a first aspect, an embodiment of the disclosure provides a light sensing module, including a circuit board and a light sensing device, wherein the circuit board includes a mounting region and a device region surrounding the mounting region, an encapsulation layer is disposed on the device region, and a light sensing device, a light sensing hole and a barrier structure are provided on the mounting region, a vertical projection of the light sensing device on the mounting region at least partially overlaps with a vertical projection of the light sensing hole on the mounting region, and the barrier structure is disposed around a periphery of the light sensing hole, and separates the encapsulation layer from the light sensing hole.

In an exemplary embodiment, the barrier structure includes a groove disposed on the mounting region.

In an exemplary embodiment, in a direction perpendicular to the circuit board, the mounting region includes a substrate, a first conductive layer disposed on one side of the substrate close to the light sensing device and a second conductive layer disposed on one side of the substrate away from the first conductive layer, and the light sensing device is connected to the first conductive layer.

In an exemplary embodiment, the light sensing device includes at least one bonding pad, and the light sensing device is soldered with the first conductive layer through the at least one bonding pad.

In an exemplary embodiment, in a direction perpendicular to the circuit board, the groove penetrates through the first conductive layer to expose the substrate.

In an exemplary embodiment, the mounting region further includes a conductive structure located between the groove and the light sensing hole, and the conductive structure connects the first conductive layer with the second conductive layer, so that the light sensing device is connected to the second conductive layer through the first conductive layer.

In an exemplary embodiment, the conductive structure is a blind hole disposed on a side of the substrate away from the light sensing device.

In an exemplary embodiment, in the direction perpendicular to the circuit board, the mounting region further includes a protective layer disposed on a side of the first conductive layer away from the substrate.

In an exemplary embodiment, the barrier structure includes a barrier wall disposed on the mounting region.

In an exemplary embodiment, the barrier structure includes a groove and a barrier wall disposed on the mounting region, wherein the barrier wall is located on one side of the groove close to the light sensing hole.

In an exemplary embodiment, the barrier wall has a screen printing structure.

In an exemplary embodiment, the barrier structure is circular or rectangular.

In a second aspect, an embodiment of the disclosure provides a display apparatus, which includes any of the aforementioned light sensing modules.

Of course, an implementation of any product or method in the embodiments of the present disclosure does not need to achieve all the advantages mentioned above at the same time. Other features and advantages of the present disclosure will be set forth in the following embodiments of the description, and in part will become apparent from the embodiments of the description, or be learned by practice of the present disclosure. Purposes and other advantages of the technical solutions of the present disclosure may be achieved and acquired by structures specified in the detailed description, claims and drawings.

Other aspects may be comprehended upon reading and understanding of the drawings and the detailed descriptions.

BRIEF DESCRIPTION OF DRAWINGS

The drawings provide a further understanding of technical solutions of the present disclosure, form a part of the specification, and are used to explain, together with the embodiments of the present disclosure, the technical solutions of the present disclosure and not intended to form limitations on the technical solutions of the present disclosure. The shape and size of each component in the drawings do not reflect true scales and only to be used to schematically illustrate contents of the present disclosure.

DETAILED DESCRIPTION

Figure 1:
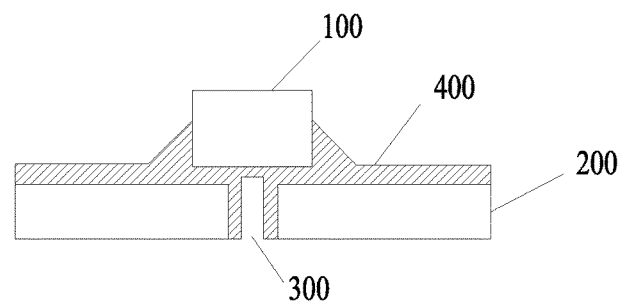
FIG. 1 is a sectional view of a light sensing module.

Hereinafter, the embodiments of the present disclosure will be described in detail in combination with the accompanying drawings. It should be noted that the embodiments may be implemented in many different forms. Those of ordinary skills in the art may readily understand the fact that implementations and contents may be transformed into a variety of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the drawings, the size of each constituent element, or the thickness or area of a layer, is sometimes exaggerated for clarity. Therefore, an implementation of the present disclosure is not necessarily limited to the size shown, and a shape and size of each component in the drawings do not reflect true scales. In addition, the drawings schematically show ideal examples, and an implementation of the present disclosure is not limited to the shapes or values shown in the drawings.

The ordinal numbers "first", "second", "third" and the like in this specification are used to avoid confusion between constituent elements, but not to constitute limitations on quantities.

In this specification, for sake of convenience, words indicating orientation or positional relations, such as "central", "upper", "lower", "front", "rear", "vertical", "horizontal", "top", "bottom", "inner", "outer" and the like which are used to describe the positional relations between constituent elements with reference to the drawings, the words are only for a purpose of facilitating description of this specification and simplifying the specification, rather than indicating or implying that the apparatus or element referred to must have a specific orientation, or must be constructed and operated in a particular orientation, and therefore may not be construed as limitations on the present disclosure. The positional relations between the constituent elements may be appropriately changed according to the direction in which constituent elements are described. Therefore, the wordings are not limited in the specification, and may be replaced appropriately according to situations.

In this specification, terms "install", "connect" and "couple" shall be understood in a broad sense unless otherwise explicitly specified and defined. For example, a connection may be a fixed connection, or a detachable connection, or an integrated connection; it may be a mechanical connection, or an electrical connection; it may be a direct connection, or an indirect connection through middleware, or an internal connection between two elements. Those of ordinary skills in the art may understand the meanings of the terms in the present disclosure according to specific situations.

In this specification, an "electrical connection" includes a case where constituent elements are connected together through an element having a certain electric action. The "element having a certain electrical action" is not particularly limited as long as it may transmit and receive electrical signals between connected constituent elements. Examples of the "element with a certain electric action" include not only electrodes and wirings, but also switching elements such as transistors, resistors, inductors, capacitors, and other elements having various functions.

In this specification, "parallel" refers to a state in which two straight lines form an angle above −10 degrees and below 10 degrees, includes a state in which the angle is above −5 degrees and below 5 degrees. In addition, "perpendicular" refers to a state in which an angle formed by two straight lines is above 80 degrees and below 100 degrees, and thus may include a state in which the angle is above 85 degrees and below 95 degrees.

In this specification, "film" and "layer" may be interchangeable. For example, sometimes "conductive layer" may be replaced by "conductive film". Similarly, "insulating film" may sometimes be replaced by "insulating layer".

"About" in the present disclosure means that limits of a value are not limited strictly, and the value is within a range of process and measurement errors.

FIG. 1 is a sectional view of a light sensing module. As shown in FIG. 1, a light sensing device 100 is disposed on a circuit board 200, wherein a light sensing hole 300 is formed in the circuit board 200, and the light sensing device 100 corresponds to the light sensing hole 300. Light from the outside may enter the light sensing device 100 through the light sensing hole 300 and to be received by the light sensing device 100, so that the intensity of outside light may be detected. Since the device region outside the light sensing hole in the circuit board 200 needs to be soldered with components, it is necessary to provide an encapsulation layer 400 around solder joints of the components, or even encapsulate it to protect the solder joints of the components. In a process of forming the encapsulation layer 400, the material of the encapsulation layer 400 may easily flow into the light sensing hole 300, which in turn blocks the light sensing hole 300, causing a light sensitivity of the light sensing device 100 to decrease or even reach zero.

By replacing the material of the encapsulation layer 400 with a higher viscosity (poor fluidity) material or keeping the light sensing hole 300 away from the device region, the problem of the encapsulation layer 40 blocking the light sensing hole 300 by0 may be solved. However, replacing the material of the encapsulation layer 400 with a material with higher viscosity is prone to incomplete dispensing or lack of glue, which eventually affects the mounting of components and is time-consuming and effort-consuming. On the other hand, keeping the light sensing hole 300 away from the device region is restricted by the position of the light sensing hole 300, and a mounting position of the light sensing device 100 is also restricted.

Figure 2:
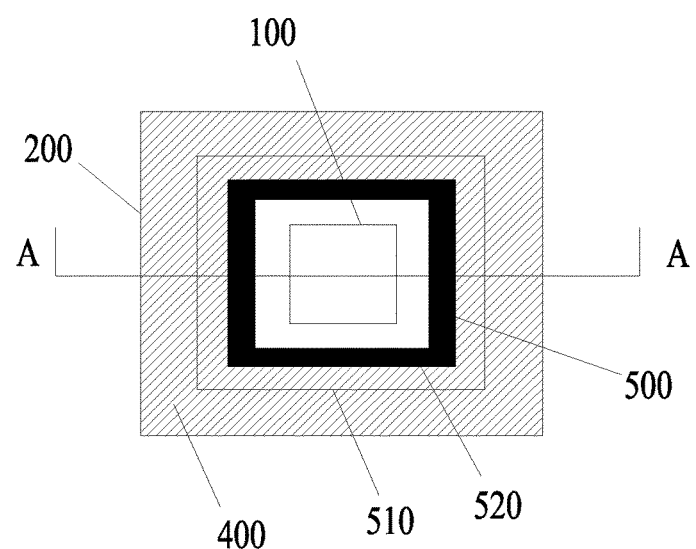
FIG. 2 is a top view of a light sensing module according to an embodiment of the present disclosure.
Figure 3:
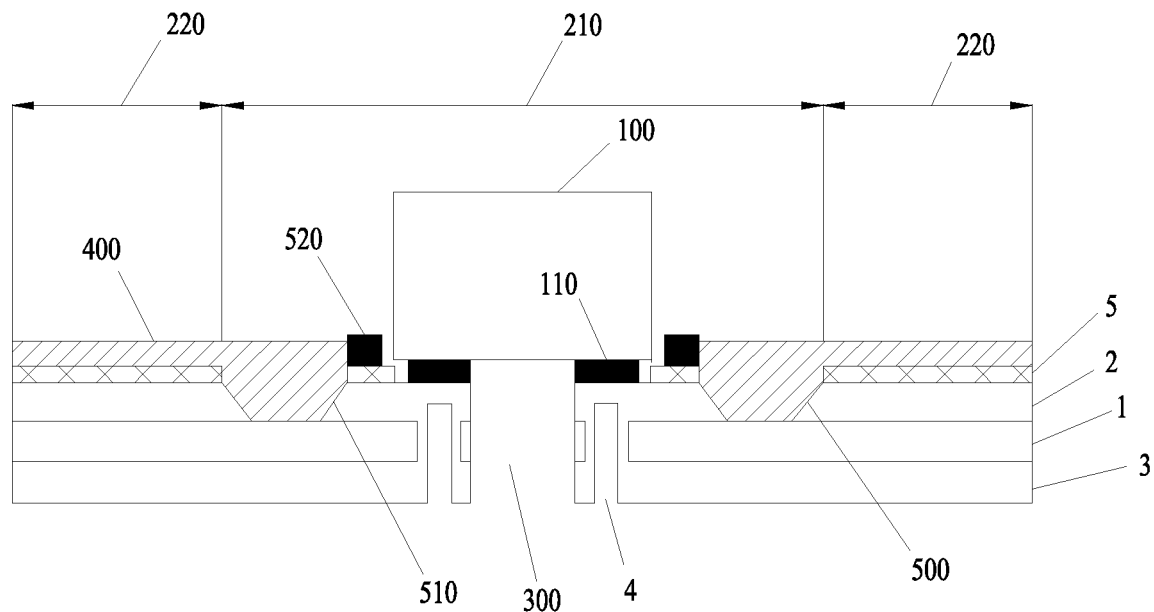
FIG. 3 is a sectional view of a light sensing module according to an embodiment of the present disclosure.

FIG. 2 is a top view of a light sensing module according to an embodiment of the present disclosure. FIG. 3 is a sectional view of a light sensing module according to an embodiment of the present disclosure. FIG. 3 illustrates a sectional view taken along A-A direction in FIG. 2 as an example. As shown in FIG. 2 and FIG. 3, an embodiment of the present disclosure provides a light sensing module, which includes a circuit board 200 and a light sensing device 100. In a direction parallel to the circuit board 200, the circuit board 200 includes a mounting region 210 and a device region 220 surrounding the mounting region 210. The device region 220 includes connection bonding pads and components, and the components are soldered with the connection bonding pads. The encapsulation layer 400 is disposed around the solder joints between the components and the connection bonding pads. For example, the encapsulation layer 400 is made of a colloidal material and is formed around the solder joints between the components and the connection bonding pads by a dispensing process. The encapsulation layer 400 is used to protect the solders joint between the components and the connection bonding pads, and prevent the solder joints between the components and the connection bonding pads from being corroded by water vapor, which results in a short circuit. The mounting region 210 is provided with the light sensing device 100, the light sensing hole 300 and a barrier structure 500. A vertical projection of the light sensing device 100 on the mounting region 210 and a vertical projection of the light sensing hole 300 on the mounting region 210 at least partially overlap, so that the light sensing region of the light sensing device 100 corresponds to the light sensing hole 300, allowing external light to enter the light sensing device 100 through the light sensing hole 300, and be received by the light sensing device 100, thereby the intensity of external ambient light may be detected. The barrier structure 500 is disposed around the light sensing hole 300. The barrier structure 500 and the encapsulation layer 400 are located on the same side of the circuit board 200, which separate the encapsulation layer 400 from the light sensing hole 300 to prevent the material of the encapsulation layer 400 from flowing into the light sensing hole 300 and blocking the light sensing hole 300, and thereby solving the problem of the decrease of light sensitivity of the light sensing device 100 and improving the product yield.

In an exemplary embodiment, the shape of the light sensing hole 300 may be circular, elliptical, polygonal (e.g., rectangular), etc.

In an exemplary embodiment, the barrier structure 500 includes a groove 510 disposed on the mounting region 210. The groove 510 is disposed around the light sensing hole 300, providing a flow guide space for the material of the encapsulation layer 400 to make the material of the encapsulation layer 400 flow, which can effectively divert the material of the encapsulation layer 400 close to the light sensing hole 300, prevent the material of the encapsulation layer 400 from flowing into the light sensing hole 300, and reduce the light sensitivity.

In an exemplary embodiment, in a direction perpendicular to the circuit board 200, the mounting region 210 includes a substrate 1, a first conductive layer 2 disposed on one side of the substrate 1 close to the light sensing device 100 and a second conductive layer 3 disposed on one side of the substrate 1 away from the first conductive layer 2. The first conductive layer 2 is exposed in the mounting region 210, and is connected to the light sensing device 100. Illustratively, the light sensing device 100 is soldered with the first conductive layer 2.

In an exemplary embodiment, the light sensing device 100 includes at least one bonding pad 110, for example, the light sensing device 100 includes four bonding pads 110, and the light sensing device 100 is soldered with the first conductive layer 2 through the bonding pads 110, so that the light sensing device 100 is electrically connected to the first conductive layer 2.

In an exemplary embodiment, in a direction perpendicular to the circuit board 200, the groove 510 penetrates through the first conductive layer 2, exposing the substrate 1, so that the material of the encapsulation layer 400 can be effectively diverted and prevented from overflowing the groove 510.

In an exemplary embodiment, in the direction perpendicular to the circuit board 200, a cross section of the groove 510 may take various shapes, for example, the cross section of the groove 510 is a U-shaped groove or a trapezoidal groove. The U-shaped groove has better drainage effect, while the trapezoidal groove has simple manufacturing process and low cost.

In an exemplary embodiment, in the direction parallel to the circuit board 200, the groove 510 may have various shapes, for example, the groove 510 is rectangular, as shown in FIG. 2, the rectangular groove 510 has simple manufacturing process and low cost. Alternatively, the groove 510 is circular, and the circular groove 510 has a better drainage effect.

Figure 4:
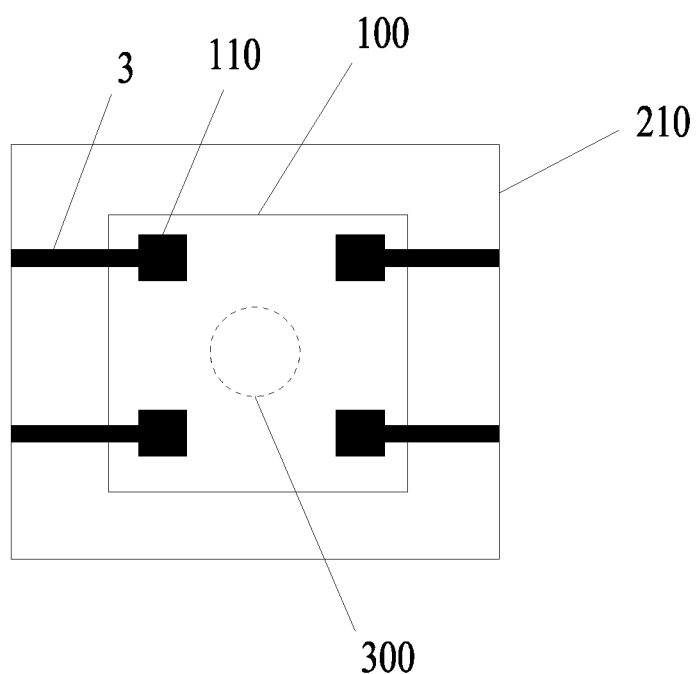
FIG. 4 is a schematic diagram of wiring of a light sensing module according to an embodiment of the present disclosure.

FIG. 4 is a schematic diagram of wiring of a light sensing module according to an embodiment of the present disclosure. As shown in FIG. 3 and FIG. 4, in an exemplary embodiment, the light sensing device 100 in the embodiment of the present disclosure is wired at the back of the mounting region 210, which refers to the side of the mounting region 210 away from the light sensing device 100. In an exemplary embodiment, the mounting region 210 further includes a conductive structure 4, wherein the conductive structure 4 is located between the groove 510 and the light sensing hole 300 in the direction parallel to the circuit board 200. In the direction perpendicular to the circuit board 200, the conductive structure 4 connects the first conductive layer 2 with the second conductive layer 3, so that the light sensing device 100 is connected to the second conductive layer 3 through the first conductive layer 2. The second conductive layer 3 then serves as a signal lead of the light sensing device 100, so that the light sensing device 100 may be wired at the back of the mounting region 210.

In an exemplary embodiment, the conductive structure 4 is a blind hole provided on a side of the substrate 1 away from the light sensing device 100, and the blind hole penetrates the substrate 1 to connect the first conductive layer 2 with the second conductive layer 3. In the embodiment of the present disclosure, the first conductive layer 2 and the second conductive layer 3 are connected through the blind hole, which can prevent solder from flowing into the holes of the bonding pads in the light sensing device 100 when the light sensing device 100 is soldered on the first conductive layer 2.

In an exemplary embodiment, in the direction perpendicular to the circuit board 200, the mounting region 210 further includes a protective layer 5 disposed on one side of the first conductive layer 2 away from the substrate 1, and the protective layer 5 is used for protecting the first conductive layer 2.

In an exemplary embodiment, as shown in FIG. 3, the barrier structure 500 further includes a barrier wall 520 disposed on the mounting region 210, that is, the barrier structure 500 includes a groove 210 disposed on the mounting region 210 and a barrier wall 520, wherein the barrier wall 520 is disposed around the light sensing hole 300. The barrier wall 520 is located on one side of the groove 210 close to the light sensing hole 300. A side surface of the barrier wall 520 away from the mounting region is higher than that of the mounting region. For example, a distance between a side surface of the barrier wall 520 close to the mounting region and a side surface of the substrate 1 close to the barrier wall 520 is equal to a depth of the groove 210 to form a height difference between the barrier wall 520 and the groove 210, allowing the material of the encapsulating layer 400 flowing towards the light sensing hole 300 to flow into the groove 210 first and diverted in the groove 210, and then blocked by the barrier wall 520, so that the material of the encapsulating layer 400 is prevented from overflowing the groove 210 and flowing into the light sensing hole 300.

In an exemplary embodiment, the barrier wall has a screen printing structure and is manufactured in the mounting region 210 by a screen printing process, which is simple.

In some embodiments, the barrier structure may only be a groove; or, the barrier structure may only be a barrier wall, which will not be described in detail here in the embodiments of the present disclosure.

Taking the circuit board 200 in the embodiment of the present disclosure as a Flexible Printed Circuit (FPC) board as an example, a method for manufacturing the light sensing module in the embodiment of the present disclosure will be explained. The method for manufacturing the light sensing module in the embodiment of the disclosure includes the following steps:

S1, drilling holes on a substrate to form a communication hole and a blind hole; herein, a substrate material may simply be a non-metal base material well-known to those skilled in the art, which is not limited in this embodiment. In this embodiment, a preferred substrate material is a Liquid Crystal Polymer (LCP) material, a Polyimide Film (PI) material, a Modified Polyimide Film (MPI) material or a Polyethylene Terephthalate (PT) material.

S2, metallizing the communication hole in the substrate to form a conductive metal layer covering an inner wall of the communication hole. In an exemplary embodiment of the present disclosure, the communication hole on the substrate may be metalized by chemical plating, black holes or shadows. In this step, the communication hole on the substrate is metallized, so that the printed wires between each layer of the circuit board may communicate with each other through the conductive metal layer attached to the inner wall of the communication hole.

S3, respectively forming copper plating layers on an upper surface and a lower surface of the substrate; herein, the copper plating layer on the upper surface of the substrate is connected to the copper plating layer on the lower surface of the substrate through the blind hole.

S4, respectively forming dry film layers on the copper plating layers on the upper surface and the lower surface of the substrate; then exposing and developing the dry film layers, keeping the dry film layer of the device region and the mounting region on the substrate, removing the dry film layer of regions except the device region and the mounting region on the substrate to expose the copper plating layer; then, removing the copper plating layer except in the device region and the mounting region on the substrate through an etching process, and finally removing the dry film layer on the device region and mounting region on the upper surface of the substrate, exposing the copper plating layer on the device region and mounting region on the upper surface of the substrate to form a first conductive layer; and removing the dry film layer on the device region and mounting region on the lower surface of the substrate, exposing the copper plating layer on the device region and mounting region on the lower surface of the substrate to form a second conductive layer.

In the etching process, the copper plating layer of the mounting region on the upper surface of the substrate is etched by the etching process to form a groove; e.g., the groove exposes the upper surface of the substrate.

S5, punching the substrate to form a light sensing hole. Herein, the groove is disposed around the periphery of the light sensing hole.

S6, forming a barrier wall on the mounting region, wherein the barrier wall is disposed around the light sensing hole and is positioned on one side of the groove close to the light sensing hole. For example, screen printing lines are printed around the light sensing hole to form a screen printing structure, and the screen printing structure forms a barrier wall.

An embodiment of the present disclosure further provides a display apparatus which includes the light sensing module in any of the aforementioned embodiments. The display device of the embodiment of the present disclosure may be any product or component with a display function, such as a cell phone, a tablet computer, a television, a display, a laptop computer, a digital photo frame, and a navigator.

The drawings in the present disclosure only refer to structures involved in the present disclosure, and other structures may refer to common designs. The embodiments of the present disclosure, i.e., features in the embodiments may be combined with each other to obtain new embodiments if there is conflict.

Those of ordinary skills in the art should understand that modifications or equivalent substitutions may be made to the technical solutions of the present disclosure without departing from the spirit and scope of the technical solutions of the present disclosure, all of which should be included within the scope of the claims of the present disclosure.

What is claimed is:

1. A light sensing module, comprising a circuit board and a light sensing device, wherein the circuit board comprises a mounting region and a device region surrounding the mounting region, the device region comprises connection bonding pads and connection components, the connection components are soldered with the connection bonding pads, an encapsulation layer is disposed around solder joints between the connection components and the connection bonding pads, and the light sensing device, a light sensing hole and a barrier structure are provided on the mounting region, a vertical projection of the light sensing device on the mounting region at least partially overlaps with a vertical projection of the light sensing hole on the mounting region, the light sensing hole is configured to allow external light to enter the light sensing device, and the barrier structure is disposed around a periphery of the light sensing hole, and separates the encapsulation layer from the light sensing hole;
wherein the barrier structure comprises a groove disposed on the mounting region.

2. The light sensing module according to claim 1, wherein in a direction perpendicular to the circuit board, the mounting region comprises a substrate, a first conductive layer disposed on one side of the substrate close to the light sensing device and a second conductive layer disposed on one side of the substrate away from the first conductive layer, and the light sensing device is connected to the first conductive layer.

3. The light sensing module according to claim 2, wherein the light sensing device comprises at least one bonding pad and the light sensing device is soldered with the first conductive layer through the at least one bonding pad.

4. The light sensing module according to claim 2, wherein in a direction perpendicular to the circuit board, the groove penetrates through the first conductive layer to expose the substrate.

5. The light sensing module according to claim 4, wherein the mounting region further comprises a conductive structure located between the groove and the light sensing hole, and the conductive structure connects the first conductive layer with the second conductive layer, so that the light sensing device is connected to the second conductive layer through the first conductive layer.

6. The light sensing module according to claim 5, wherein the conductive structure is a blind hole disposed on a side of the substrate away from the light sensing device.

7. The light sensing module according to claim 2, wherein in the direction perpendicular to the circuit board, the mounting region further comprises a protective layer disposed on a side of the first conductive layer away from the substrate.

8. The light sensing module according to claim 1, wherein the barrier structure comprises a barrier wall disposed on the mounting region.

9. The light sensing module according to claim 8, wherein the barrier wall has a screen printing structure.

10. The light sensing module according to claim 1, wherein the barrier structure comprises a groove and a barrier wall disposed on the mounting region, and the barrier wall is located on one side of the groove close to the light sensing hole.

11. The light sensing module according to claim 1, wherein the barrier structure is circular or rectangular.

12. A display apparatus, comprising a light sensing module which comprises a circuit board and a light sensing device, wherein the circuit board comprises a mounting region and a device region surrounding the mounting region, the device region comprises connection bonding pads and connection components, the connection components are soldered with the connection bonding pads, an encapsulation layer is disposed around solder joints between the connection components and the connection bonding pads, and the light sensing device, a light sensing hole and a barrier structure are provided on the mounting region, a vertical projection of the light sensing device on the mounting region at least partially overlaps with a vertical projection of the light sensing hole on the mounting region, the light sensing hole is configured to allow external light to enter the light sensing device, and the barrier structure is disposed around a periphery of the light sensing hole, and separates the encapsulation layer from the light sensing hole;

wherein the barrier structure comprises a groove disposed on the mounting region.

13. The display apparatus according to claim 12, wherein in a direction perpendicular to the circuit board, the mounting region comprises a substrate, a first conductive layer disposed on one side of the substrate close to the light sensing device and a second conductive layer disposed on one side of the substrate away from the first conductive layer, and the light sensing device is connected to the first conductive layer.

14. The display apparatus according to claim 13, wherein the light sensing device comprises at least one bonding pad and the light sensing device is soldered with the first conductive layer through the at least one bonding pad.

15. The display apparatus according to claim 13, wherein in the direction perpendicular to the circuit board, the groove penetrates through the first conductive layer to expose the substrate.

16. The display apparatus according to claim 13, wherein in the direction perpendicular to the circuit board, the mounting region further comprises a protective layer disposed on a side of the first conductive layer away from the substrate.

17. The display apparatus according to claim 12, wherein the barrier structure comprises a barrier wall disposed on the mounting region.

18. The display apparatus according to claim 12, wherein the barrier structure is round or rectangular.

* * * * *